(12) United States Patent
Cho et al.

(10) Patent No.: US 11,276,743 B2
(45) Date of Patent: Mar. 15, 2022

(54) DISPLAY APPARATUS

(71) Applicant: SAMSUNG DISPLAY CO., LTD., Yongin-si (KR)

(72) Inventors: Seung-Hwan Cho, Yongin-si (KR); Jong Hyun Choi, Seoul (KR); Gyung Soon Park, Seoul (KR); Juchan Park, Seoul (KR); Seungmin Song, Gwangju (KR); Minseong Yi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 42 days.

(21) Appl. No.: 16/842,473

(22) Filed: Apr. 7, 2020

(65) Prior Publication Data

US 2020/0395429 A1 Dec. 17, 2020

(30) Foreign Application Priority Data

Jun. 17, 2019 (KR) .................. 10-2019-0071439

(51) Int. Cl.
*H01L 27/32* (2006.01)
*H01L 51/56* (2006.01)

(52) U.S. Cl.
CPC ...... *H01L 27/3276* (2013.01); *H01L 27/3211* (2013.01); *H01L 27/3223* (2013.01); *H01L 27/3246* (2013.01); *H01L 51/56* (2013.01)

(58) Field of Classification Search
None
See application file for complete search history.

(56) References Cited

U.S. PATENT DOCUMENTS

| 2017/0077188 | A1* | 3/2017 | Kang | .................. H01L 27/3248 |
| 2018/0331124 | A1* | 11/2018 | Cho | .................... H01L 27/3276 |
| 2019/0140200 | A1 | 5/2019 | Lee et al. | |
| 2020/0381506 | A1* | 12/2020 | Kang | .................... G02F 1/1345 |
| 2020/0388230 | A1* | 12/2020 | Lee | ....................... G09G 3/3275 |
| 2021/0098494 | A1* | 4/2021 | Feng | .................... G02F 1/13458 |

FOREIGN PATENT DOCUMENTS

| EP | 3 462 499 A2 | 4/2019 |
| KR | 10-1486038 | 1/2015 |
| KR | 10-2015-0078593 A | 7/2015 |
| KR | 10-2016-0081704 A | 7/2016 |
| KR | 10-2018-0125061 A | 11/2018 |
| WO | WO 2017/127563 A1 | 7/2017 |

\* cited by examiner

*Primary Examiner* — Erik Kielin
(74) *Attorney, Agent, or Firm* — Lewis Roca Rothgerber Christie LLP

(57) ABSTRACT

A display apparatus includes: a substrate including a display area in which a plurality of pixel areas is arranged, and a peripheral area adjacent to the display area and in which a pad portion including a plurality of pad electrodes is arranged; a first signal line and a second signal line in the display area on the substrate; a first connecting line electrically connected to the first signal line and connected to the pad portion, at least a portion of the first connecting line being in the display area; and a dummy line on a same layer as the first connecting line.

19 Claims, 15 Drawing Sheets

DISPLAY APPARATUS

CROSS-REFERENCE TO RELATED APPLICATION

This application claims priority to and the benefit of Korean Patent Application No. 10-2019-0071439, filed on Jun. 17, 2019 in the Korean Intellectual Property Office, the entire content of which is herein incorporated by reference.

BACKGROUND

1. Field

Aspects of embodiments of the inventive concept relate to a display apparatus.

2. Description of the Related Art

Recently, a display apparatus having light weight and small size has been manufactured. A cathode ray tube (CRT) display apparatus has been used due to a performance and a competitive price. However the CRT display apparatus has a weakness with a size or portability. Therefore a display apparatus such as a plasma display apparatus, a liquid crystal display apparatus, and an organic light emitting display apparatus has been highly regarded due to a small size, light weight, and low power consumption.

In general, the display apparatus may include a rectangular display area and a peripheral area that is a non-display area surrounding the display area. Recently, a display apparatus that has rounded or chamfered corners or an edge-type display apparatus wherein images are displayed on side surfaces has been developed.

In this case, there is a problem in that the non-display area is increased and the display area is reduced by arranging signal wires for transmitting an image signal to the corners and the side surfaces.

SUMMARY

According to an aspect of one or more embodiments of the inventive concept, a display apparatus capable of improving display quality is provided.

According to one or more embodiments of the inventive concept, a display apparatus includes: a substrate including a display area in which a plurality of pixel areas is arranged, and a peripheral area adjacent to the display area and in which a pad portion including a plurality of pad electrodes is arranged; a first signal line and a second signal line in the display area on the substrate; a first connecting line electrically connected to the first signal line and connected to the pad portion, wherein at least a portion of the first connecting line is in the display area; and a dummy line on a same layer as the first connecting line.

In an embodiment, the first connecting line may include a horizontal line portion extending in a first direction and a vertical line portion extending in a second direction perpendicular (perpendicular or substantially perpendicular) to the first direction.

In an embodiment, vertical branches may be extended from the horizontal line portion in the second direction.

In an embodiment, the plurality of pixel areas may include: a first pixel area overlapping the second signal line; a second pixel area overlapping the horizontal line portion of the first connecting line; and a third pixel area overlapping the vertical line portion of the first connecting line. The second pixel area and the third pixel area may be closer to an edge of the display area than the first pixel area.

In an embodiment, the dummy line may include a horizontal dummy line extending in the first direction and a vertical dummy line extending in the second direction. The horizontal dummy line and the vertical dummy line may overlap the first pixel area. The vertical dummy line in the first pixel area may have at least one disconnection portion.

In an embodiment, the display area may be arranged in a rectangular shape along the first and second directions, and four corners of the display area may have a chamfered or rounded shape. The peripheral area extends in the first direction adjacent to the display area in the second direction, the pad portion extends in the first direction, and the pad electrodes may be arranged in the first direction.

In an embodiment, the display area may further include a side display area which is extended from at least one edge of the display area and bent.

In an embodiment, the display apparatus may further include: a thin film transistor layer on the substrate; a first conductive pattern on the thin film transistor; a first via insulating layer on the first conductive pattern; and a second conductive pattern on the first via insulating layer. The first conductive pattern may include the first and second signal lines, and the second conductive pattern may include the first connecting line and the dummy line.

In an embodiment, the display apparatus may further include a pixel defining layer on the substrate, the first and second signal lines, the connecting lines, and the dummy lines, and defining an opening corresponding to each of the plurality of pixel areas which is emitting area. Patterns of circuit wirings under the opening of the first pixel area, the opening of the second pixel area, and the opening of the third pixel area may be the same (the same or substantially the same).

In an embodiment, the first pixel area, the second pixel area, and the third pixel area may each emit light having a same color.

In an embodiment, each of the plurality of pixel areas may include any of a red pixel emitting red light, a green pixel emitting green light, and a blue pixel emitting blue light. Red or blue light may be emitted in the first pixel area, the second pixel area, and the third pixel area.

In an embodiment, the display apparatus may further include a pixel defining layer on the substrate, the first and second signal lines, the connecting lines, and the dummy lines, and defining an opening corresponding to each of the plurality of pixel areas which is an emitting area. The pixel defining layer may include a black pigment or a black dye.

In an embodiment, the display apparatus may further include: a planarization insulating layer on the second conductive pattern; a third conductive pattern on the planarization insulating layer and including a first electrode including a reflective material; a light emitting layer on the first electrode; and a second electrode on the light emitting layer.

In an embodiment, the display apparatus may further include vertical branches and adjacent vertical branches adjacent to the vertical branches and extending in a same direction as an extending direction of the vertical branches. The vertical branches and the adjacent vertical branches may form a disconnection portion. The third conductive pattern may further include a cover electrode overlapping the disconnection portion.

In an embodiment, the display apparatus may further include: a thin film transistor layer on the substrate; a first conductive pattern on the thin film transistor layer; a first via insulating layer on the first conductive pattern; a second conductive pattern on the first via insulating layer; a second via insulating layer on the second conductive pattern; a light emitting structure on the second via insulating layer; a thin film encapsulation layer on the light emitting structure; and a touch line on the thin film encapsulation layer. The first conductive pattern may include the first and second data lines. The second conductive pattern may include the first connecting line and the dummy line. The display apparatus further include vertical branches and adjacent vertical branches adjacent to the vertical branches and extending in a same direction as an extending direction of the vertical branches. The vertical branches and the adjacent vertical branches may form a disconnection portion. The dummy line may have at least one disconnection portion. The touch line may overlap the at least one disconnection portion.

In an embodiment, the touch line may include a plurality of lines that cross each other, and an intersection where the lines cross may overlap the at least one disconnection portion.

In an embodiment, the dummy line and the connecting line may together form a matrix lattice with respect to the plurality of pixel areas, and the dummy line and the connecting line may include at least one disconnected portion formed therein.

According to one or more embodiments of the inventive concept, a display apparatus includes a substrate; a thin film transistor layer on the substrate; a first conductive pattern on the thin film transistor layer and including a first data line and a second data line; a first via insulating layer on the first conductive pattern; and a second conductive pattern including a connecting line electrically connected to the first data line, and a dummy line spaced apart from the connecting line. The connecting line and the dummy line extend in a first direction and a second direction perpendicular (perpendicular or substantially perpendicular) to the first direction to form a matrix lattice defining a plurality of pixel areas. In a pixel area of the plurality of pixel areas, at least one disconnection portion is formed in the connection line or the dummy line.

In an embodiment, the plurality of pixel areas may include a first pixel area in which the dummy line is located, and a second pixel area in which the connection line is located. The dummy line of the first pixel area and the connecting line of the second pixel area may have a same shape in a plane view except for a position of the disconnection portion.

In an embodiment, the display apparatus may further include: a second via insulating layer on the second conductive pattern; a third conductive pattern on the second via insulating layer and including a reflective material, the third conductive pattern including a first electrode and a cover electrode overlapping the disconnection portion; a light emitting layer on the first electrode; and a second electrode on the light emitting layer.

According to aspects of embodiments of the present inventive concept, the display apparatus includes connecting lines disposed in the display area, the non-display area adjacent to an edge of the display area can be reduced, and the display area can be increased. In addition, it is possible to minimize or reduce unevenness due to deviation of a wiring configuration for each pixel. Therefore, display quality can be improved.

BRIEF DESCRIPTION OF THE DRAWINGS

The above and other aspects and features of the inventive concept will become more apparent by describing in further detail some embodiments thereof with reference to the accompanying drawings, in which.

DETAILED DESCRIPTION

Figure 1:
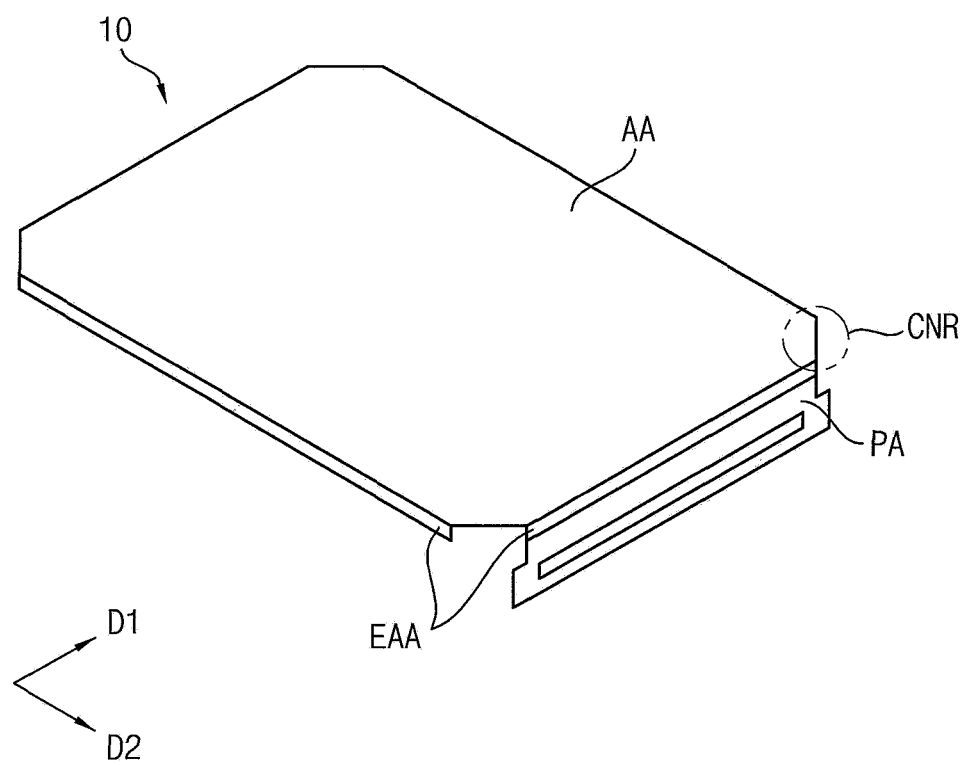
FIG. 1 is a perspective view of a display apparatus according to an embodiment of the inventive concept.

Herein, some embodiments of the inventive concept will be described in further detail with reference to the accompanying drawings. The inventive concepts may, however, be embodied in many different forms, and should not be construed as limited to the embodiments set forth herein.

In the present disclosure, it is to be understood that when an element or layer is referred to as being "on," "connected to," or "coupled to" another element or layer, it may be directly on, connected, or coupled to the other element or layer, or one or more intervening elements or layers may be present.

Like numerals refer to like elements throughout. In the drawings, the thickness, ratio, and dimensions of components may be exaggerated for ease of description of the technical content.

As used herein, the term "and/or" includes any and all combinations of one or more of the associated listed items.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a "second" element, component, region, layer, or section without departing from the teachings of the present disclosure. As used herein, the singular forms, "a," "an," and "the" are intended to include the plural forms as well, unless the context clearly indicates otherwise.

Spatially relative terms, such as "beneath," "below," "lower," "above," "upper," and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It is to be further understood that terms, such as those defined in commonly used dictionaries, should be interpreted as having a meaning that is consistent with their meaning in the context of the relevant art and are not to be interpreted in an idealized or overly formal sense unless expressly so defined herein.

Figure 2:
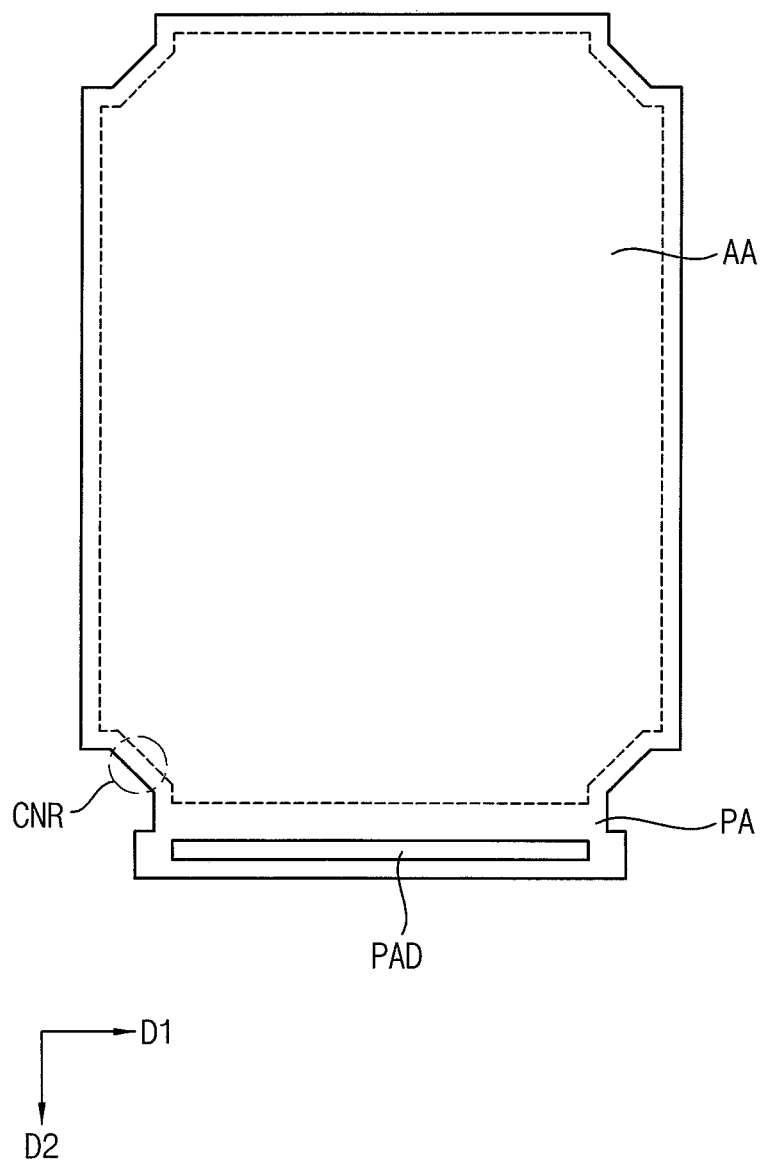
FIG. 2 is a plan view showing the display apparatus of FIG. 1 in an unfolded state.

FIG. 1 is a perspective view of a display apparatus according to an embodiment of the inventive concept; and FIG. 2 is a plan view showing the display apparatus of FIG. 1 in an unfolded state.

Referring to FIGS. 1 and 2, a display apparatus 10 may include a display area AA in which an image is displayed, and a peripheral area PA which is a non-display area adjacent to the display area AA.

An image is displayed in the display area AA, and a plurality of pixel areas may be arranged. In an embodiment, the display area AA may be positioned at a center of a substrate of the display apparatus 10 and may have a polygonal shape. For example, as illustrated, the display area AA may be formed in a rectangular shape along a first direction D1 and a second direction D2 perpendicular to the first direction D1. In an embodiment, four corners CNR of the display area DA may have a chamfered shape. In an embodiment, although not shown, the four corners CNR may have a rounded shape.

The display area AA may further include a side display area EAA extending from at least one edge of the display area AA and bent. For example, as shown in the drawings, the display area AA may further include the side display areas EAA extending from four edges of the display area AA and bent at a curvature (e.g., a predetermined curvature). Accordingly, a four-sided edge display apparatus may be implemented.

The peripheral area PA may extend in the first direction D1 adjacent to the display area AA in the second direction D2. A pad portion PAD including a plurality of pad electrodes may be disposed in the peripheral area PA. The pad portion PAD may extend in the first direction D1, and the plurality of pad electrodes may be arranged in the first direction D1.

Figure 3:
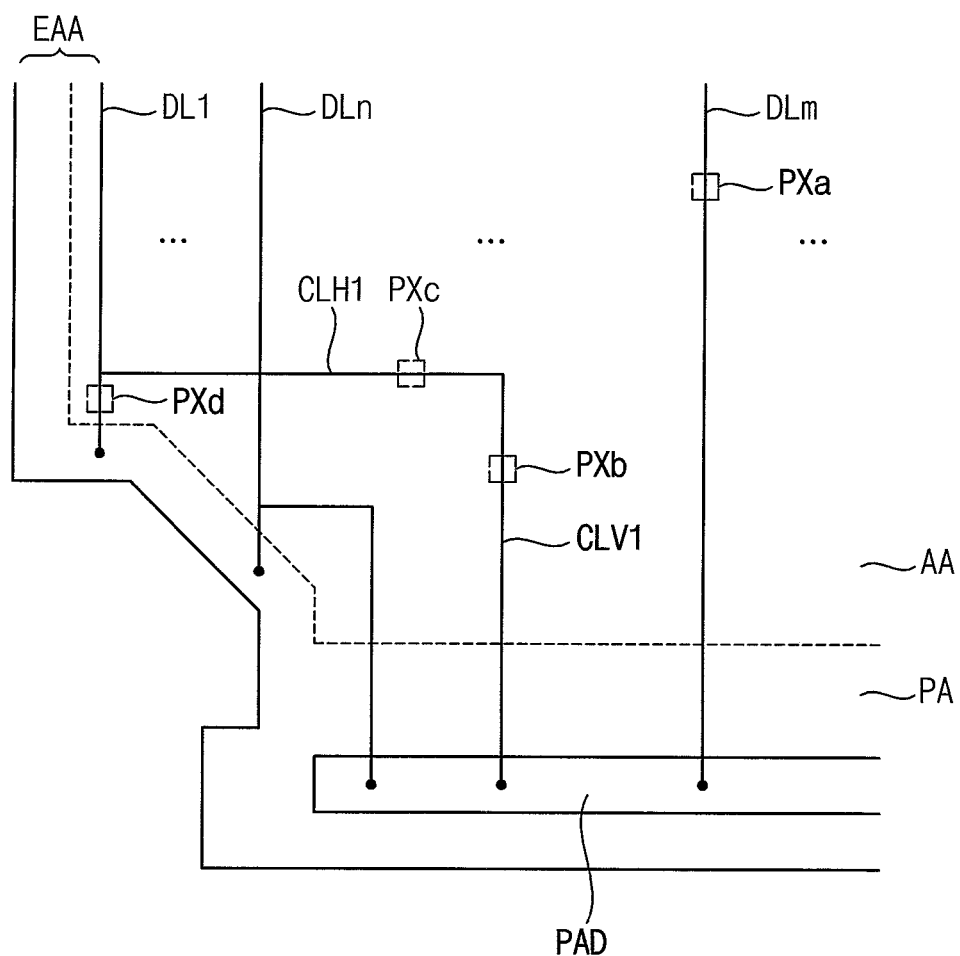
FIG. 3 is an enlarged view of a region of FIG. 2.
Figure 3:
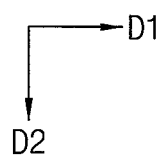

FIG. 3 is an enlarged view of a region of FIG. 2. Specifically, FIG. 3 is an enlarged view of a lower left corner region of FIG. 2.

Referring to FIGS. 1 to 3, the display apparatus may further include a plurality of data lines DL1, DLn, DLm, and a plurality of connecting lines.

The data lines may include a first data line DL1, an n-th data line DLn, and an m-th data line DLm, each extending in the second direction D2 (n is a natural number greater than or equal to 2, m is a natural number greater than n).

The connecting lines may include a first connecting lines CLH1 and CLV1. The first connecting line may include a horizontal line portion CLH1 extending in the first direction D1 and a vertical line portion CLV1 extending in the second direction D2.

The first connecting line may be electrically connected to the first data line DL1. In FIG. 3, the first connecting line is shown as being in contact with the first data line DL1 (indicated by a dot on the drawing) in the non-display area and the corner CNR, but the present invention is not limited thereto. For example, the first data line DL1 and the horizontal line portion CLH1 of the first connecting line may contact each other in the display area AA.

At least a portion of the first connecting line may be disposed in the display area AA, and may have a structure connected to the pad portion PAD. Accordingly, a size of the non-display area can be reduced compared to a case in which the first data line DL1 is arranged in a form of a spider wire (or a fan-out wire) in the non-display area of the corner CNR.

In an embodiment, the pixel areas in the display area AA may include a first pixel area PXa overlapping the m-th data line DLm, a second pixel area PXb overlapping the vertical line portion CLV1 of the first connecting line, a third pixel area PXc overlapping the horizontal line portion CLH1 of the first connecting line, and a fourth pixel area PXd overlapping the first data line DL1 and the first connecting line.

Here, the fourth pixel area PXd, the second pixel area PXb, and the third pixel area PXc may be disposed closer to the corner CNR of the display area AA than the first pixel area PXa. That is, the first pixel area PXa may be a pixel area where the connecting line is not disposed, and the second to fourth pixel areas PXb, PXc, and PXd are pixel areas where the connecting line is disposed.

Figure 4:
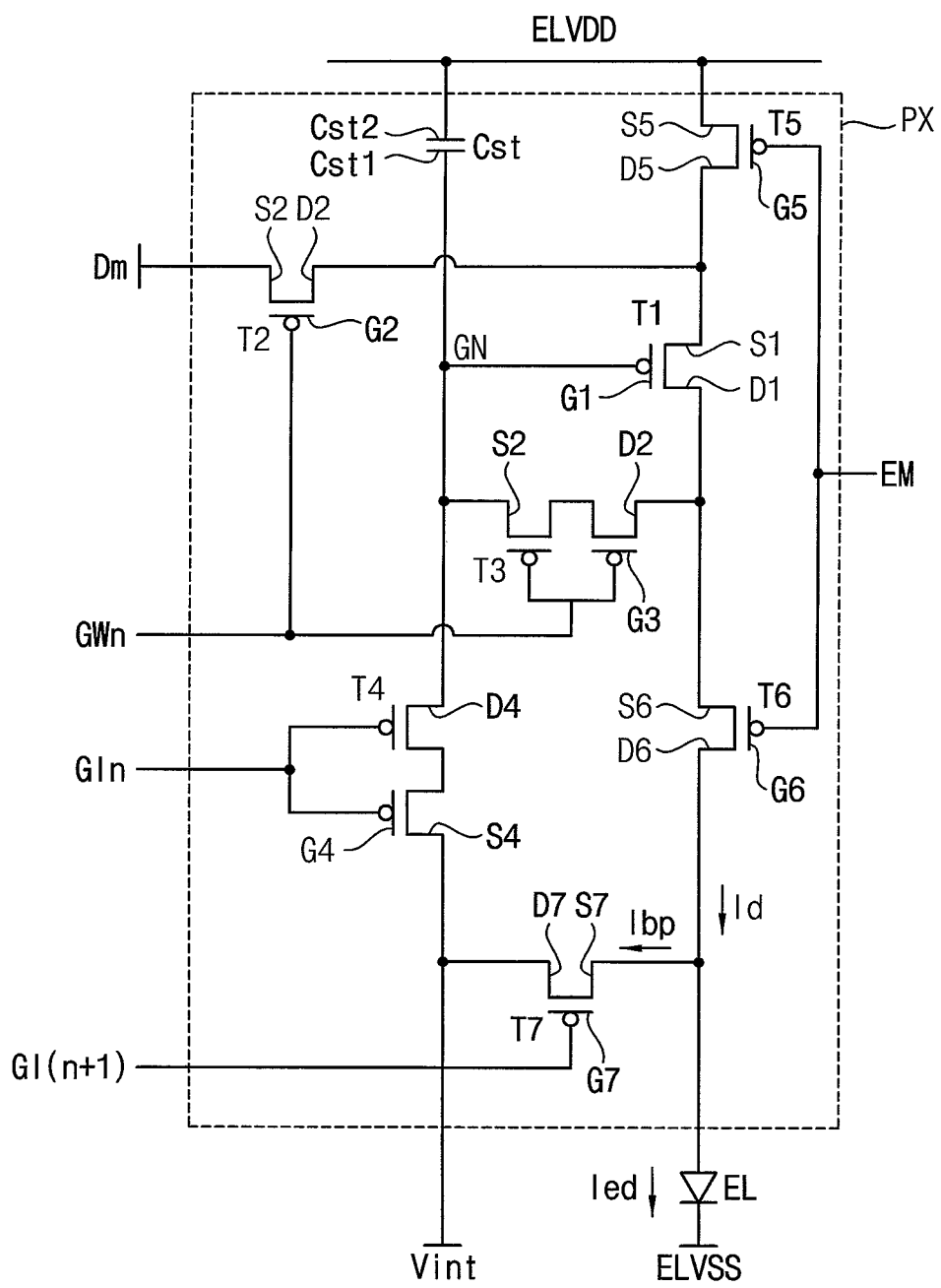
FIG. 4 is an equivalent circuit diagram of a pixel of a display device according to an embodiment of the inventive concept.

FIG. 4 is an equivalent circuit diagram of a pixel of a display device according to an embodiment.

In an embodiment, as shown in FIG. 4, a display device includes a plurality of pixels PX that displays an image corresponding to a video signal, and a plurality of signal lines. Each pixel PX may include a plurality of transistors T1, T2, T3, T4, T5, T6, and T7 that are connected to the plurality of signal lines, a capacitor Cst, and a light emitting diode EL. Herein, for convenience of description, an embodiment, in which each pixel PX includes a single light emitting diode EL, will be described, but embodiments are not limited thereto. In another embodiment, each pixel PX includes two or more light emitting diodes.

The signal lines may include a plurality of scan lines, a plurality of control lines, a plurality of data lines, and a plurality of driving voltage lines.

The plurality of scan lines may respectively transmit scan signals GWn, Gin, and GI(n+1). The scan signals GWn, Gin, and GI(n+1) may transmit a gate on voltage and a gate off voltage that can turn on and turn off the transistors T2, T3, T4, and T7 included in each pixel PX.

The scan lines that are connected to one pixel PX may include a first scan line that transmits the scan signal GWn, a second scan line that has a gate on voltage at a different time from those of the first scan line and a third scan line, which transmits the scan signal GI(n+1). Herein, for convenience of description, an embodiment, in which the second scan line transmits a gate on voltage at a time prior to the first scan line will be described. In an embodiment, for example, the scan signal GWn is an n-th scan signal Sn (here, n is a natural number greater than 1) among scan signals applied during one frame period, the scan signal GIn may be a previous scan signal such as an (n−1)-th scan signal S(n−1), and the scan signal GI(n+1) may be an n-th scan signal Sn, but not being limited thereto. In another embodiment, the scan signal GI(n+1) may be a scan signal other than the n-th scan signal Sn.

The control line may transmit a control signal, e.g., an emission control signal that controls emission of the light emitting diode EL included in the pixel PX. The control signal transmitted by the control line may transmit a gate on voltage and a gate off voltage, and may have a waveform that is different from that of scan signals transmitted by the scan lines.

The data lines may transmit a data signal Dm, and the driving voltage line may transmit a driving voltage ELVDD. The data signal Dm may have a voltage level that varies according to a video signal input to the display device, and the driving voltage ELVDD may have a substantially constant voltage level.

In an embodiment, as shown in FIG. 4, the transistors T1, T2, T3, T4, T5, T6, and T7 in each pixel PX may include a first transistor T1, a second transistor T2, a third transistor T3, a fourth transistor T4, a fifth transistor T5, a sixth transistor T6, and a seventh transistor T7.

In such an embodiment, the first scan line may transmit a scan signal GWn to the second transistor T2 and the third transistor T3, the second scan line may transmit a scan signal GIn to the fourth transistor T4, the third scan line may transmit a scan signal GI(n+1) to the seventh transistor T7, and the control line may transmit an emission control signal EM to the fifth transistor T5 and the sixth transistor T6.

A gate electrode G1 of the first transistor T1 is connected to a first end Cst1 of the capacitor Cst through a driving gate node GN, a source electrode S1 of the first transistor T1 is connected to the driving voltage line via the fifth transistor T5, and a drain electrode D1 of the first transistor T1 is electrically connected to an anode of the light emitting diode EL via the sixth transistor T6. The first transistor T1 receives the data signal Dm transmitted from the data line according to a switching operation of the second transistor T2, and supplies a driving current Id to the light emitting diode EL.

A gate electrode G2 of the second transistor T2 is connected to the first scan line, a source electrode S2 of the second transistor T2 is connected to the data line, and a drain electrode D2 of the second transistor T2 is connected to the driving voltage line via the fifth transistor T5 while being connected to the source electrode S1 of the first transistor T1. The second transistor T2 is turned on by the scan signal GWn received through the first scan line, and transmits the data signal Dm received from the data line to the source electrode S1 of the first transistor T1.

A gate electrode G3 of the third transistor T3 is connected to the first scan line, and a source electrode S3 of the third transistor T3 is connected to the anode of the light emitting diode EL via the sixth transistor T6 while being connected to the drain electrode D1 of the first transistor T1. A drain electrode D3 of the third transistor T3 is connected to a drain electrode D4 of the fourth transistor T4, the first end Cst1 of the capacitor Cst, and the gate electrode G1 of the first transistor T1. The third transistor T3 is turned on according to the scan signal GWn received through the first scan line, and diode-connects the first transistor T1 by connecting the gate electrode G1 and the drain electrode D1 of the first transistor T1 to each other.

A gate electrode G4 of the fourth transistor T4 is connected to the second scan line, a source electrode S4 of the fourth transistor T4 is connected to an initialization voltage (Vint) terminal, and a drain electrode D4 of the fourth transistor T4 is connected to the first end Cst1 of the capacitor Cst and the gate electrode G1 of the first transistor T1 through the drain electrode D3 of the third transistor T3. The fourth transistor T4 is turned on according to the scan signal GIn received through the second scan line, and transmits the initialization voltage Vint to the gate electrode G1 of the first transistor T1 for performing an initialization operation to initialize a voltage of the gate electrode G1 of the first transistor T1.

A gate electrode G5 of the fifth transistor T5 is connected to the control line, a source electrode S5 of the fifth transistor T5 is connected to the driving voltage line, and a drain electrode D5 of the fifth transistor T5 is connected to the source electrode S1 of the first transistor T1 and the drain electrode D2 of the second transistor T2.

A gate electrode G6 of the sixth transistor T6 is connected to the control line, a source electrode S6 of the sixth transistor T6 is connected to the drain electrode D1 of the first transistor T1 and the source electrode S3 of the third transistor T3, and a drain electrode D6 of the sixth transistor T6 is electrically connected to the anode of the light emitting diode EL. The fifth transistor T5 and the sixth transistor T6 are concurrently (e.g., simultaneously) turned on according to the light emission control signal EM received through the control line, and, thus, the driving voltage ELVDD is compensated by the diode-connected first transistor T1 through the turned-on fifth and sixth transistors T5 and T6, and then the compensated driving voltage ELVDD is transmitted to the light emitting diode EL.

A gate electrode G7 of the seventh transistor T7 is connected to the third scan line, a source electrode S7 of the seventh transistor T7 is connected to the drain electrode D6 of the sixth transistor T6 and the anode of the light emitting diode EL, and a drain electrode D7 of the seventh transistor T7 is connected to the initialization voltage Vint terminal and the source electrode S4 of the fourth transistor T4. In another embodiment, the gate electrode G7 of the seventh transistor T7 may be connected to an additional control line (not shown).

In an embodiment, the transistors T1, T2, T3, T4, T5, T6, and T7 are P-type channel transistors, such as a P-type metal-oxide-semiconductor ("PMOS") transistor and the like, but are not limited thereto. In another embodiment, at least one of the transistors T1, T2, T3, T4, T5, T6, and T7 may be an N-type transistor.

In an embodiment, as described above, the first end Cst1 of the capacitor Cst is connected to the gate electrode G1 of the first transistor T1, and a second end Cst2 of the capacitor Cst is connected to the driving voltage line. A cathode of the light emitting diode EL is connected to a common voltage ELVSS terminal that transmits a common voltage ELVSS and receives the common voltage ELVSS.

In embodiments, the structure of the pixel PX is not limited to the structure shown in FIG. 4, and the number of transistors and the number of capacitors included in each pixel PX and a relationship therebetween may be variously modified.

An operation of the display device according to an embodiment will be described with reference to FIG. 5, together with FIG. 4. Herein, an operation during one frame period of an embodiment the display device, where the transistors T1, T2, T3, T4, T5, T6, and T7 of each pixel thereof are P-type channel transistors, will now be described.

Figure 5:
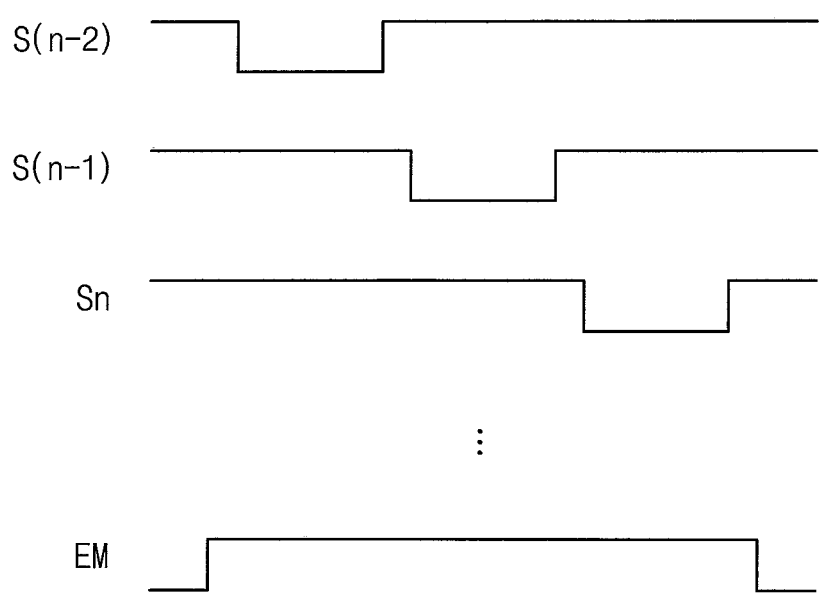
FIG. 5 is a timing diagram of driving signals of a display apparatus according to an embodiment of the inventive concept.

FIG. 5 is a timing diagram of driving signals of the display device according to an embodiment.

As shown in FIG. 5, low-level scan signals . . . , S(n−2), S(n−1), Sn, . . . may be sequentially applied to the plurality of first scan lines connected to the plurality of pixels PX in one frame period.

During an initialization period, a low-level scan signal GIn is supplied through the second scan line. The scan signal GIn may be, for example, an (n−1)-th scan signal S(n−1). Then, the fourth transistor T4 is turned on corresponding to the low-level scan signal GIn, and the initialization voltage Vint is transmitted to the gate electrode G1 of the first transistor T1 through the turned-on fourth transistor T4, and the first transistor T1 is thereby initialized by the initialization voltage Vint.

Next, when a low-level scan signal GWn is supplied through the first scan line during a data programming period and a compensation period, the second transistor T2 and the third transistor T3 are turned on in response to the low-level scan signal GWn.

The scan signal GWn may be, for example, an n-th scan signal Sn. In such an embodiment, the first transistor T1 is diode-connected by the turned-on transistor T3 and thus biased in a forward direction. Then, a compensation voltage (Dm+Vth) that is reduced by an amount of a threshold voltage (Vth) of the first transistor T1 from the data signal Dm supplied from the data line is applied to the gate electrode G1 of the first transistor T1. That is, a gate voltage applied to the gate electrode G1 of the first transistor T1 may be the compensation voltage (Dm+Vth). Here, the threshold voltage (Vth) has a negative (−) value.

The driving voltage ELVDD and the compensation voltage (Dm+Vth) are applied to opposite ends of the capacitor Cst, and a charge that corresponds to a voltage difference between the opposite ends of the capacitor Cst may be stored therein.

Next, the light emission control signal EM supplied from the control line is changed to low level from high level during a light emission period. A time, at which the light emission control signal EM is changed to the low level from the high level, may be after a time of application of the scan signal GWn to all the first scan lines in one frame period. Then, the fifth transistor T5 and the sixth transistor T6 are turned on by the low level of the light emission control signal EM during the light emission period. Thus, a driving current Id corresponding to a voltage difference between the gate voltage of the gate electrode G1 of the first transistor T1 and the driving voltage ELVDD is generated, and the driving current Id is supplied to the light emitting diode EL through the sixth transistor T6 such that a current led flows to the light emitting diode EL. A gate-source voltage (Vgs) of the first transistor T1 is maintained at (Dm+Vth)−ELVDD by the capacitor Cst during the light emission period, and according to a current-voltage relationship of the first transistor T1, the driving current Id may be proportional to a square $(Dm-ELVDD)^2$ of a value acquired by subtracting a threshold voltage from the driving gate-source voltage.

Accordingly, the driving current Id may be determined independently of the threshold voltage Vth of the first transistor T1.

In such an embodiment, during an initialization period, the seventh transistor T7 is turned on by receiving a low level of the scan signal GI(n+1) through the third scan line. The scan signal GI(n+1) may be an n-th scan signal Sn. In such an embodiment, the seventh transistor T7 may be concurrently (e.g., simultaneously) turned on with the second and third transistors T2 and T3. A part of the driving current Id may be drawn out through the seventh transistor T7 as a bypass current Ibp by the turned-on seventh transistor T7.

Figure 6A:
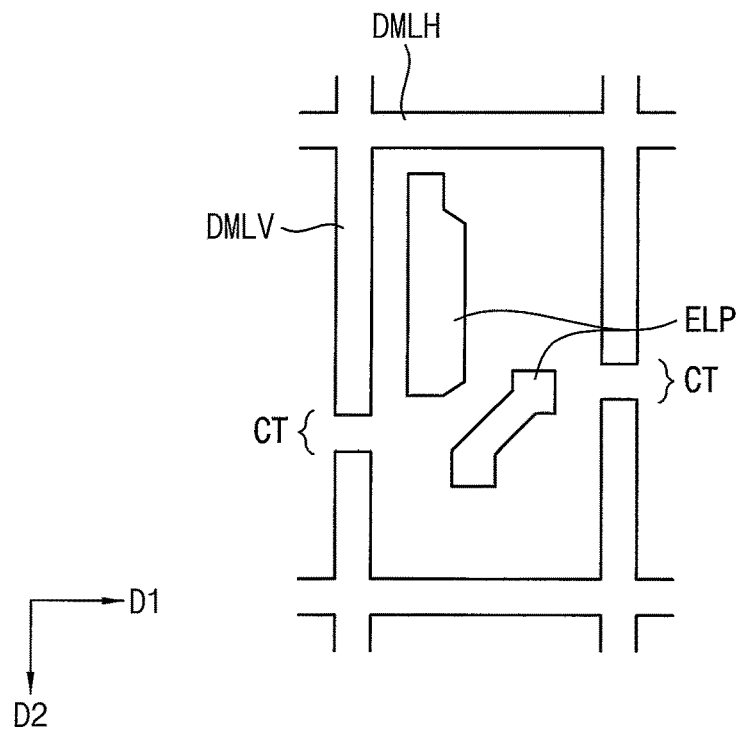
FIGS. 6A to 6C are plan views illustrating dummy lines and connecting lines in first to fourth pixel areas of the display apparatus of FIG. 2.
Figure 6B:
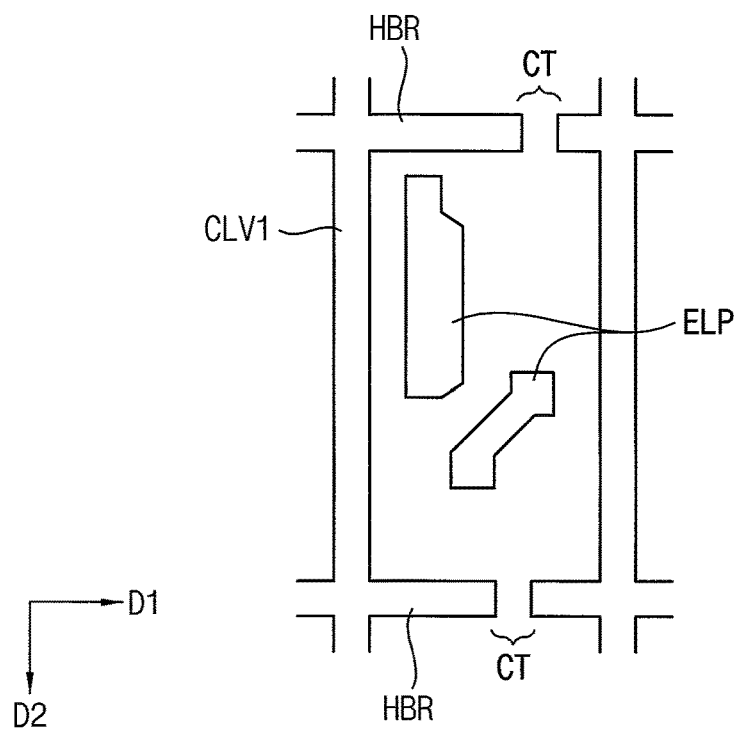
Figure 6C:
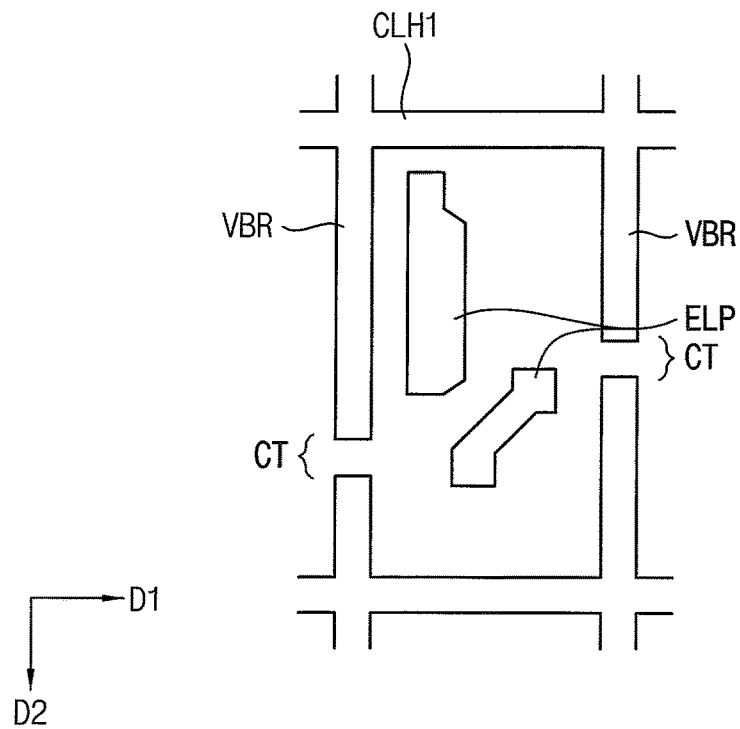

FIGS. 6A to 6C are plan views illustrating dummy lines and connecting lines in first to fourth pixel areas of the display apparatus of FIG. 2. FIG. 6A shows a first pixel area; FIG. 6B shows second and fourth pixel areas; and FIG. 6C shows a third pixel area.

Referring to FIGS. 6A to 6C, the connecting lines may include a first connecting line. The first connecting line includes a horizontal line portion CLH1 extending in a first direction D1 and a vertical line portion CLV1 extending in a second direction D2 perpendicular to the first direction D1.

Vertical branches VBR may protrude from the horizontal line portion CLH1 and extend in the second direction D2.

The vertical line portion CLV1 may have horizontal branches HBR protruding from the vertical line portion CLV1 in the first direction D1.

The dummy line may include a horizontal dummy line DMLH extending in the first direction D1 and a vertical dummy line DMLV extending in the second direction D2. The vertical dummy line DMLV in the first pixel area may have at least one disconnection portion CT.

That is, the dummy line and the connecting line together form a matrix lattice with respect to the plurality of pixel areas, and, according to a position of the disconnection portion CT formed in the dummy line and the connecting line, a desired circuit may be configured.

For example, in one pixel area, at least one disconnection portion may be formed in the connecting line or the dummy line, and the dummy line DMLH and DMLV of the first pixel area (see FIG. 6A) and the connecting line CLV1 and HBR of the second or fourth pixel area (see FIG. 6B) may have a same shape in a plane view except for a position of the disconnection portion CT. In addition, the dummy line DMLH and DMLV of the first pixel area (see FIG. 6A) and the connecting line CLH1 and VBR of the third pixel area (see FIG. 6C) may have a same shape in a plan view.

As a result, unevenness due to variation in the wiring configuration for each pixel can be minimized or reduced, and display quality can be improved.

The connecting line and the dummy line may be formed by patterning from a same layer. For example, the first connecting line and the dummy line may be included in a second conductive pattern (see FIG. 8, etc.).

Figure 7A:
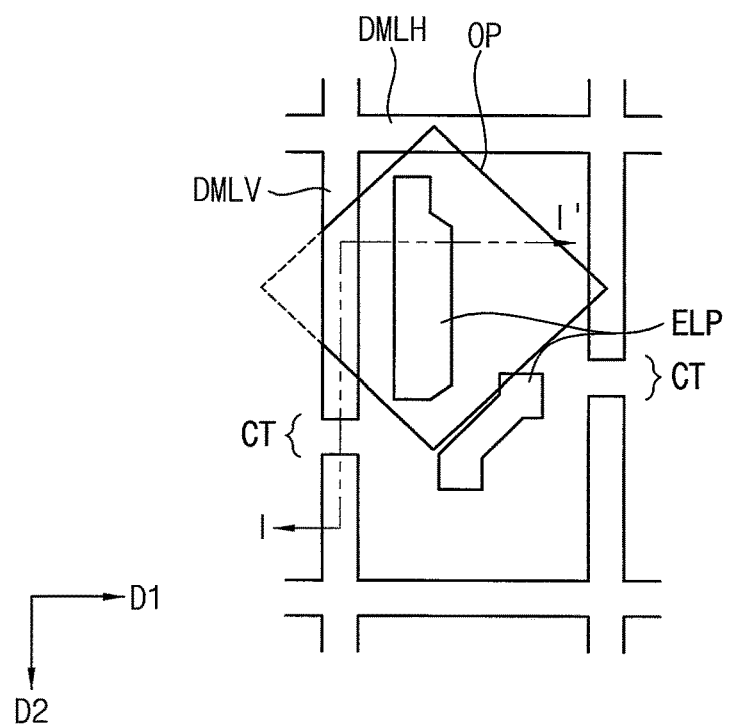
FIGS. 7A to 7C are plan views illustrating dummy wirings, connection wirings, and opening regions in first to fourth pixel areas of a display apparatus according to an embodiment of the inventive concept.
Figure 7B:
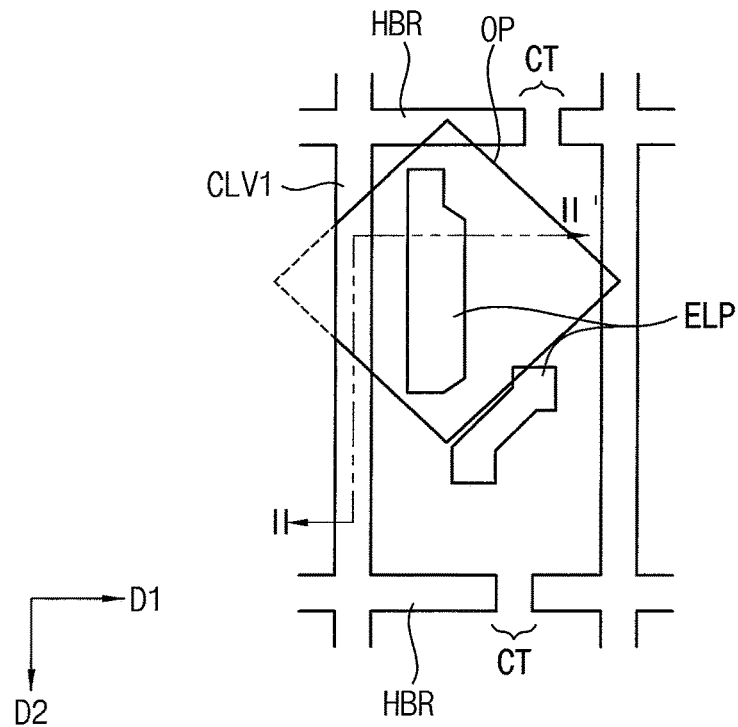
Figure 7C:
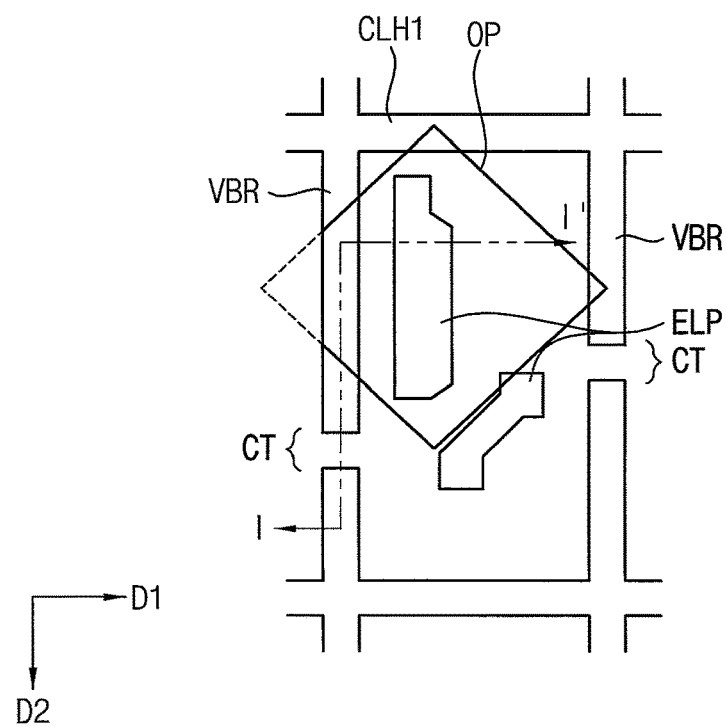
Figure 8:
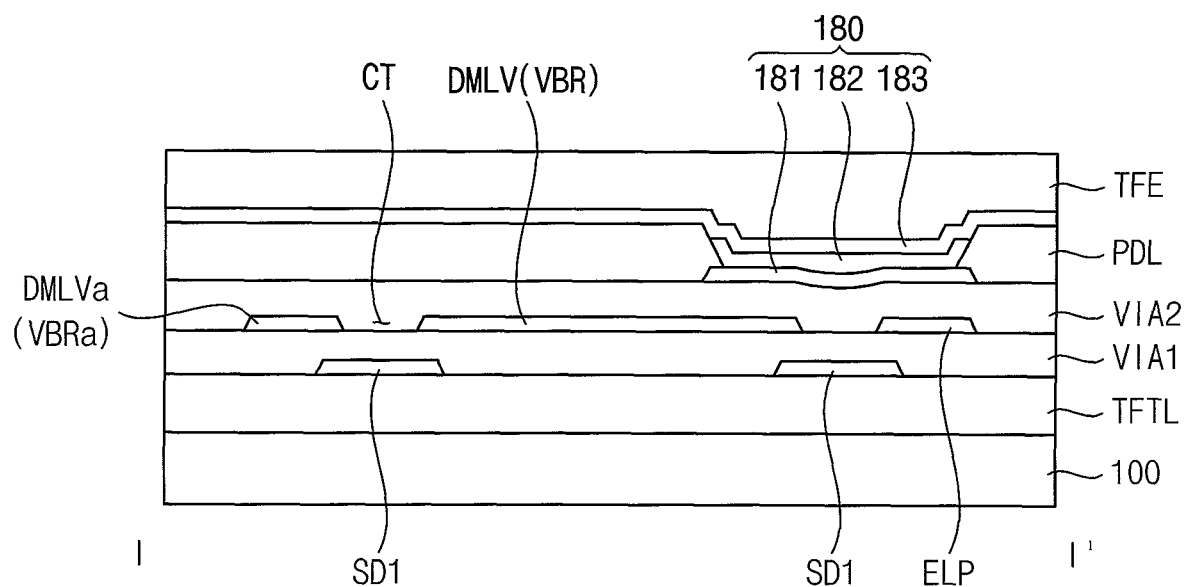
FIG. 8 is a cross-sectional view of the first or third pixel areas taken along the line I-I' of FIGS. 7A and 7C.
Figure 9:
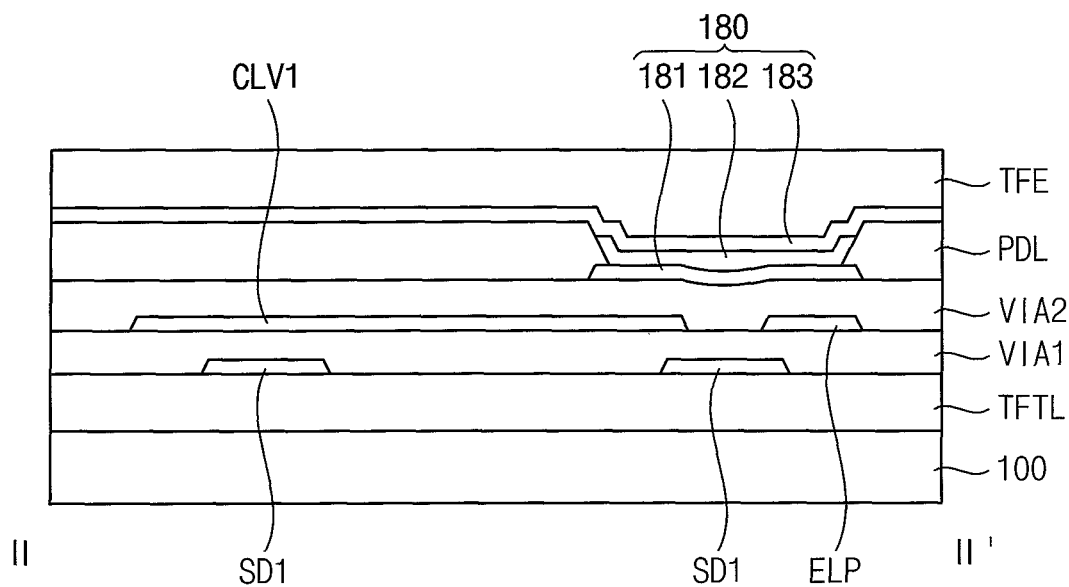
FIG. 9 is a cross-sectional view of the second or fourth pixel areas taken along the line II-II' of FIG. 7B.

FIGS. 7A to 7C are plan views illustrating dummy wirings, connection wirings, and opening regions in first to fourth pixel areas of a display apparatus according to an embodiment of the inventive concept. FIG. 7A shows a first pixel area; FIG. 7B shows second and fourth pixel areas; and FIG. 7C shows a third pixel area. FIG. 8 is a cross-sectional view of a first or third pixel area taken along the line I-I' of FIGS. 7A and 7C; and FIG. 9 is a cross-sectional view of a second or fourth pixel area taken along the line II-II' of FIG. 7B.

Referring to FIGS. 7A to 9, the display apparatus may include a substrate 100, a thin film transistor layer TFTL, a first conductive pattern SD1, a first via insulating layer VIA1, a second conductive pattern, a second via insulating layer VIA2, a pixel defining layer PDL, a light emitting structure 180, and a thin film encapsulation layer TFE.

The substrate 100 may be made of a transparent or opaque material. In an embodiment, the substrate 100 may be made of a flexible resin substrate having flexibility.

The thin film transistor layer TFTL may be disposed on the substrate 100. The thin film transistor layer TFTL may include a plurality of thin film transistors, an insulating layer, and the like. For example, the thin film transistor layer TFTL may include an active pattern disposed on the substrate 100, a gate insulating layer disposed on the active pattern, a gate electrode disposed on the gate insulating layer, and an interlayer insulating layer on the gate electrode.

The first conductive pattern SD1 may be disposed on the thin film transistor layer TFTL. The first conductive pattern SD1 may include signal lines such as data lines and voltage lines. For example, the first conductive pattern SD1 may be electrically connected to data lines (see DL1, DLn, DLm of FIG. 3), driving voltage lines (ELVDD, etc.) of the display apparatus, and source and drain electrodes electrically connected to the active pattern of the thin film transistor.

The first via insulating layer VIA1 may be disposed on the first conductive pattern SD1. The first via insulating layer VIA1 may be formed in a single layer structure, or may be formed in a multi-layer structure including at least two insulating layers.

The second conductive pattern may be disposed on the first via insulating layer VIA1. The second conductive pattern may include an electrode pattern ELP, a dummy line, and a connecting line constituting the pixel circuit. The dummy line may include a horizontal dummy line DMLH and a vertical dummy line DMLV. The connecting line may include a first connecting line including a horizontal line portion CLH1 and a vertical line portion CLV1. The vertical dummy line DMLV may form a disconnection portion CT disconnected from a vertical dummy line DMLVa extending from an adjacent pixel area.

In addition, the connecting line further includes a vertical branch VBR and a horizontal branch HBR extending from the horizontal line portion CLH1 and the vertical line portion CLV1, respectively. The vertical branch VBR may form a disconnection portion CT disconnected from a vertical branch VBRa extending from an adjacent pixel area.

The second via insulating layer VIA2 may be disposed on the second conductive pattern. The second via insulating layer VIA2 may be formed in a single layer structure, or may be formed in a multilayer structure including at least two insulating layers.

The light emitting structure 180 may include a first electrode 181, an emission layer 182, and a second electrode 183.

The first electrode 181 may be disposed on the second via insulating layer VIA2. The first electrode 181 may include a reflective material or a transmissive material in accordance with an emission type of the display apparatus. In embodiments, the first electrode 181 may have a single layer structure or a multilayer structure, which may include a metal film, an alloy film, a metal nitride film, a conductive metal oxide film, and/or a transparent conductive film. For example, the first electrode 181 may include silver (Ag).

The pixel defining layer PDL may be disposed on the second via insulating layer VIA2 on which the first electrode 181 is disposed. The pixel defining layer PDL may be formed using an organic material. For example, the pixel defining layer PDL may include photoresist, acryl-based resin, polyimide-based resin, polyamide-based resin, siloxane-based resin, etc. In some embodiments, an opening OP which exposes the first electrode 181 may be formed by etching the pixel defining layer PDL. An emitting area and a non-emitting area of the display apparatus may be defined by the opening OP of the pixel defining layer PDL. For example, a portion where the opening OP of the pixel defining layer PDL is located may correspond to an emitting area, and a non-emitting area may correspond to a portion adjacent to the opening OP of the pixel defining layer PDL.

The light emitting layer 182 may be disposed on the first electrode 181 exposed through the opening OP of the pixel defining layer PDL. In addition, the light emitting layer 182 may extend on a sidewall of the opening OP of the pixel defining layer PDL. In some embodiments, the light emitting layer 182 may include an organic light emitting layer (EL), a hole injection layer (HIL), a hole transfer layer (HTL), an electron transfer layer (ETL), an electron injection layer (EIL), etc. In some embodiments, except for the organic emission layer, the hole injection layer, the hole transport layer, the electron transport layer, and the electron injection layer may be formed in common to correspond to a plurality of pixels. In some embodiments, a plurality of organic light emitting layers may be formed using light emitting materials for generating different colors of light, such as a red color of light, a green color of light, and a blue color of light, in accordance with color pixels of the display device. In some embodiments, the organic light emitting layer of the of the light emitting layer 182 may include a plurality of stacked light emitting materials for generating a red color of light, a green color of light, and a blue color of light to thereby emit a white color of light. Here, elements of the light emitting layer 182 are commonly formed so as to correspond to a plurality of pixels, and each pixel can be divided by a color filter layer.

The second electrode 183 may be disposed on the pixel defining layer PDL and the light emitting layer 182. The second electrode 183 may include a transmissive material or a reflective material in accordance with the emission type of the display device. In embodiments, the second electrode 183 may also have a single layer structure or a multilayer structure, which may include a metal film, an alloy film, a metal nitride film, a conductive metal oxide film, and/or a transparent conductive film.

Here, in the case of pixels generating light having a same color, a pattern of a circuit wiring disposed under the opening OP of the pixel defining layer PDL may have a same structure. That is, the shape and arrangement of the first and second conductive patterns positioned under the opening OP of the first pixel area and the third pixel area in FIG. 8 may be the same (the same or substantially the same) as those of the first and second conductive patterns positioned under the opening OP in the second pixel area and the fourth pixel area in FIG. 9. Accordingly, even if unevenness is formed in the first electrode 181 by the pattern of the circuit wiring, since the unevenness is also formed in other pixels which generate light of a same color, there may be no problem of deterioration of display quality due to deviation between pixels.

The thin film encapsulation layer TFE may be disposed on the second electrode 183. The thin film encapsulation layer TFE may prevent or substantially prevent penetration of moisture and oxygen from outside. In an embodiment, the thin film encapsulation layer TFE may include at least one organic layer and at least one inorganic layer. The at least one organic layer and the at least one inorganic layer may be alternately stacked with each other. For example, the thin film encapsulation layer TFE may include two inorganic layers and one organic layer therebetween, but is not limited thereto. In some embodiments, a sealing substrate may be provided for shielding outside air and moisture from penetrating into the display apparatus instead of the thin film encapsulation layer TFE.

Figure 10:
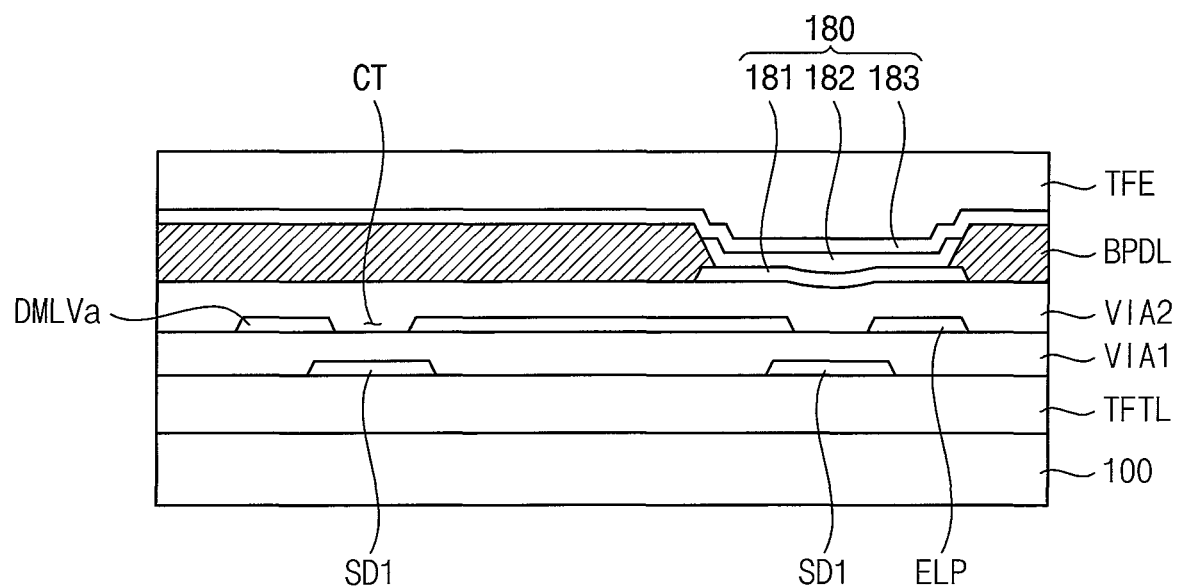
FIG. 10 is a cross-sectional view illustrating a display apparatus according to an embodiment of the inventive concept, taken along a line corresponding to the line I-I' of FIGS. 7A and 7C.

FIG. 10 is a cross-sectional view illustrating a display apparatus according to an embodiment of the inventive concept, taken along a line corresponding to the line I-I' of FIGS. 7A and 7C.

Referring to FIG. 10, a display apparatus according to an embodiment may be substantially the same as the display apparatus of FIGS. 7 to 9. Therefore, repeated description is omitted.

The display apparatus according to an embodiment may include a substrate 100, a thin film transistor layer TFTL, a first conductive pattern SD1, a first via insulating layer VIA1, a second conductive pattern, a second via insulating layer VIA2, a black pixel defining layer BPDL, a light emitting structure 180, and a thin film encapsulation layer TFE.

The black pixel defining layer BPDL may include a black pigment or a black dye. Accordingly, a wiring pattern may not be visually recognized due to the black pixel defining layer BPDL. For example, a connection line and a disconnection portion CT may be covered by the black pixel defining layer BPDL, such that unevenness due to the disconnection portion CT or the connecting line may not be visually recognized.

Figure 11:
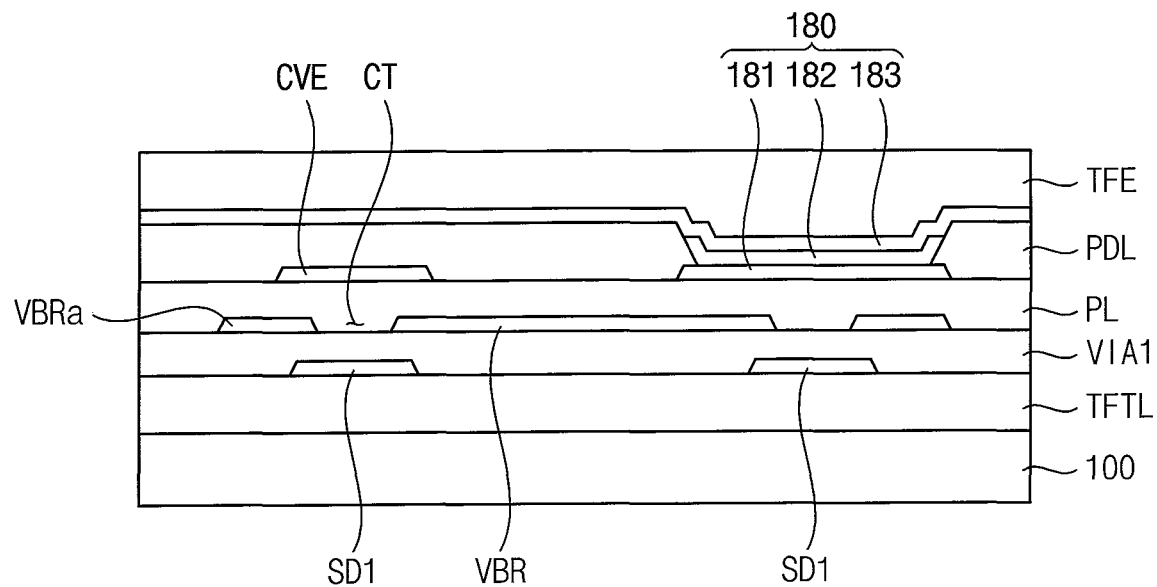
FIG. 11 is a cross-sectional view illustrating a display apparatus according to an embodiment of the inventive concept.

FIG. 11 is a cross-sectional view illustrating a display apparatus according to an embodiment of the inventive concept.

Referring to FIG. 11, a display apparatus according to an embodiment may be substantially the same as the display apparatus of FIGS. 1 to 6 except for a planarization insulating layer PL and a cover electrode CVE disposed on a disconnection portion CT. Therefore, repeated description is omitted.

The display apparatus according to an embodiment may include a substrate 100, a thin film transistor layer TFTL, a first conductive pattern SD1, a first via insulating layer VIA1, a second conductive pattern, the planarization insulating layer PL, a third conductive pattern, a pixel defining layer PDL, a light emitting structure 180, and a thin film encapsulation layer TFE.

The planarization insulating layer PL may be disposed on the first via insulating layer VIA1 on which the second conductive pattern is disposed. The planarization insulating layer PL may have a flat upper surface.

The third conductive pattern may be disposed on the planarization insulating layer PL. The third conductive pattern may include a first electrode 181 and the cover electrode CVE. The third conductive pattern may include a reflective material. For example, the third conductive pattern may include silver (Ag). Accordingly, the cover electrode CVE may be disposed to overlap the disconnection portion CT, and may include a reflective material, thereby preventing or substantially preventing the disconnection portion CT from being visually recognized.

Figure 12A:
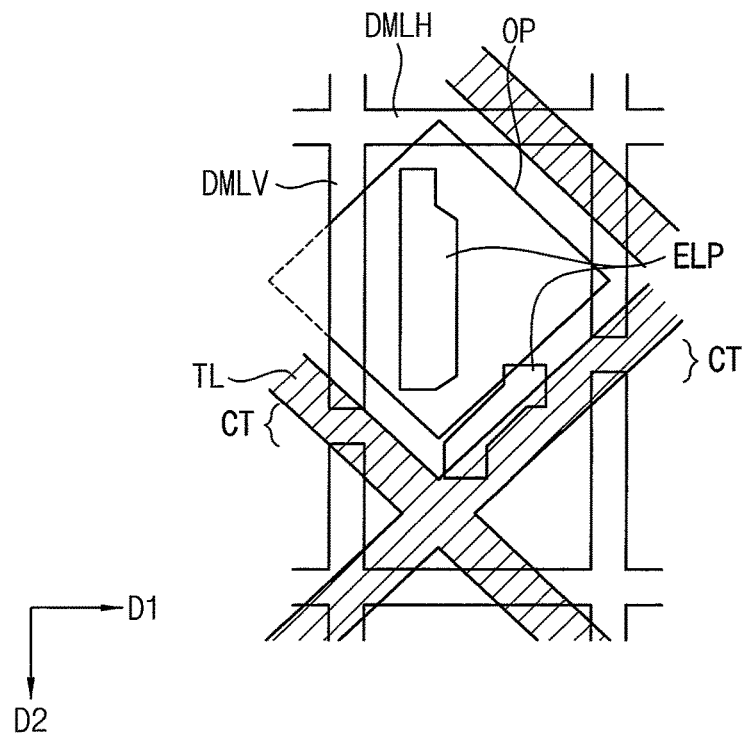
FIGS. 12A to 12C are plan views illustrating a dummy line, a connection line, an opening area, and a touch line in first to fourth pixel areas of a display apparatus according to an embodiment of the inventive concept.
Figure 12B:
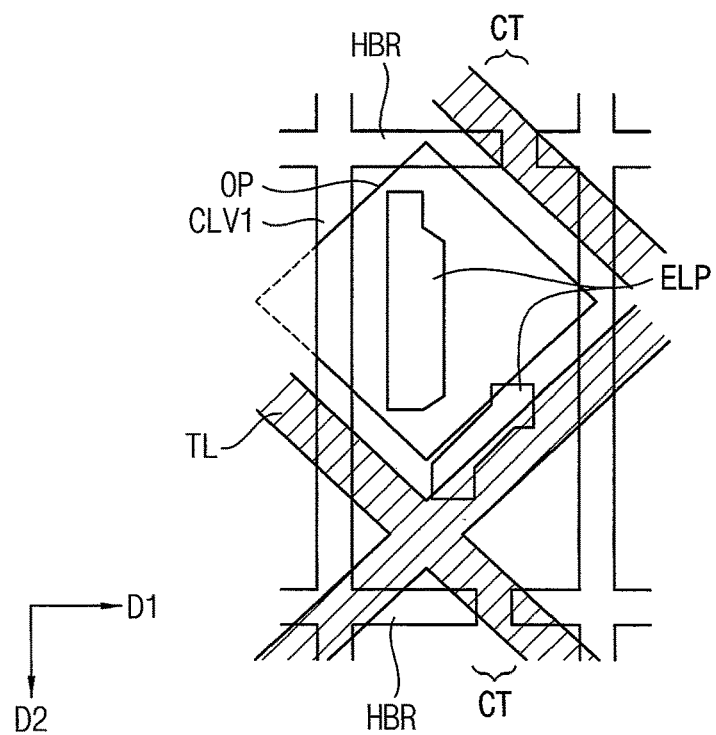
Figure 12C:
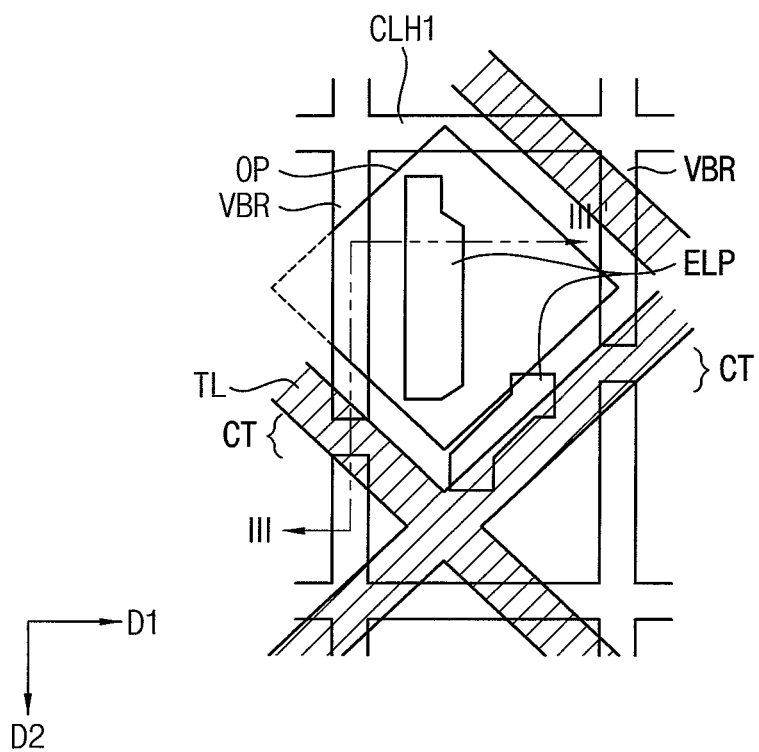
Figure 13:
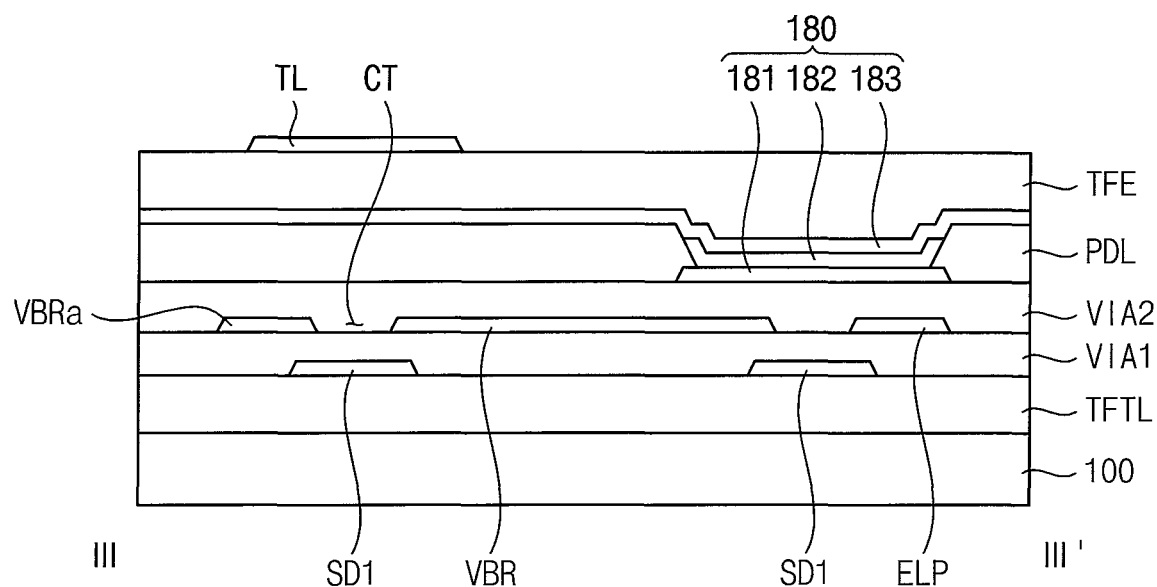
FIG. 13 is a cross-sectional view of the third pixel area taken along the line III-III' of FIG. 12C.

FIGS. 12A to 12C are plan views illustrating a dummy line, a connection line, an opening area, and a touch line in first to fourth pixel areas of a display apparatus according to an embodiment of the inventive concept. FIG. 12A shows a first pixel area; FIG. 12B shows second and fourth pixel areas; and FIG. 12C shows a third pixel area. FIG. 13 is a cross-sectional view of a third pixel area taken along the line III-III' of FIG. 12.

Referring to FIGS. 12A to 13, a display apparatus according to an embodiment may be substantially the same as the display apparatus of FIG. 7 except for a touch line TL. Therefore, repeated description is omitted.

The display apparatus according to an embodiment may include a substrate 100, a thin film transistor layer TFTL, a first conductive pattern SD1, a first via insulating layer VIA1, a second conductive pattern, a second via insulating layer VIA2, a pixel defining layer PDL, a light emitting structure 180, a thin film encapsulation layer TFE, and the touch line TL. The second conductive pattern may include an electrode pattern ELP, a dummy line, and a connecting line.

The dummy line and the connecting line may form a disconnection portion CT.

A plurality of touch lines TL crossing each other may be disposed on the thin film encapsulation layer TFE. The touch lines TL may extend to cross each other in a direction different from the first and second directions D1 and D2.

In this case, the disconnection portion CT may be disposed to overlap the touch line TL, and may minimize or reduce visibility of the disconnection portion CT due to the touch line TL.

Figure 14:
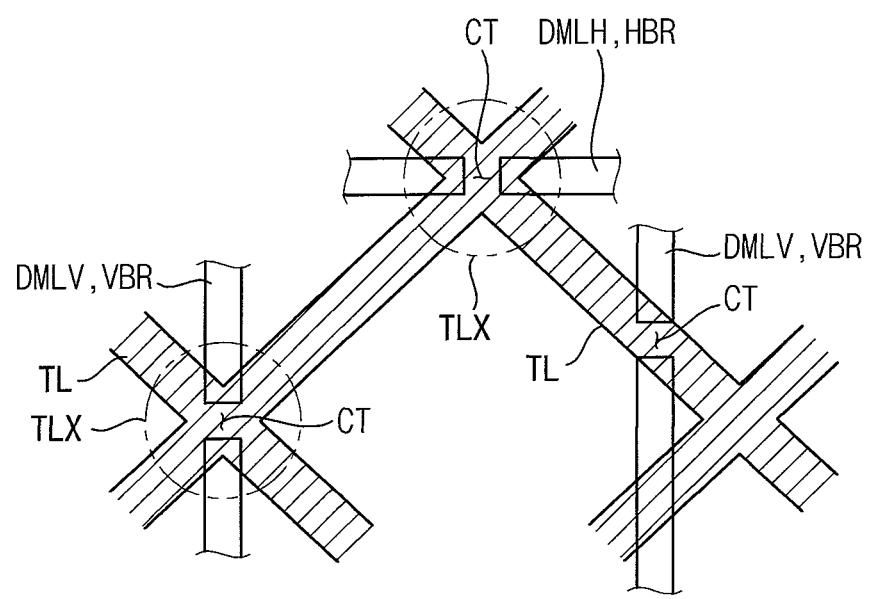
FIG. 14 is a plan view illustrating a touch line and a disconnection portion of a display apparatus according to an embodiment of the inventive concept.
Figure 15:
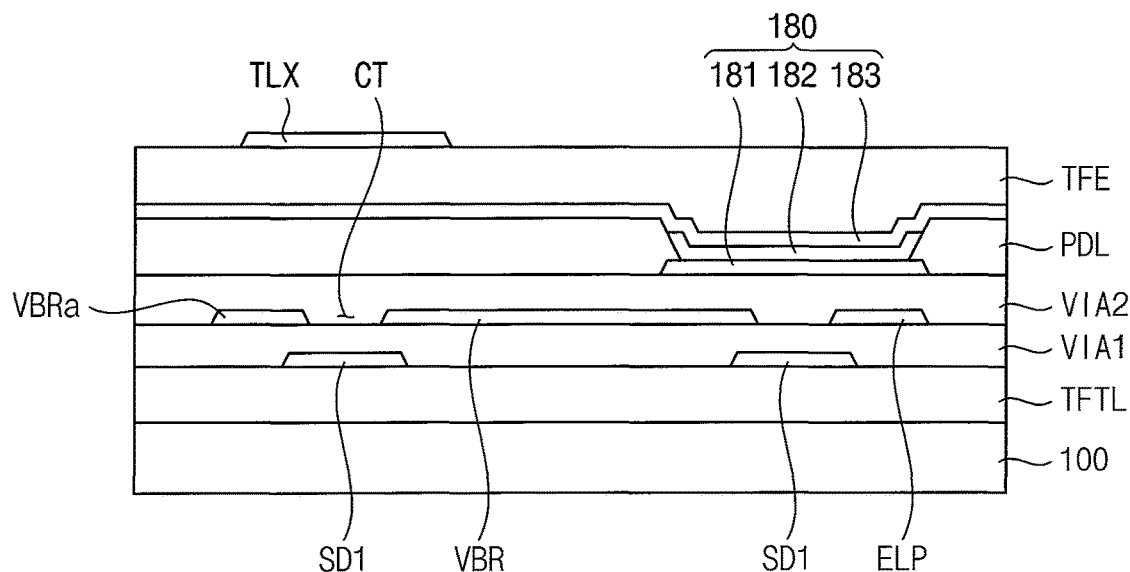
FIG. 15 is a cross-sectional view of the display apparatus of FIG. 14.

FIG. 14 is a plan view illustrating a touch line and a disconnection portion of a display apparatus according to an embodiment of the inventive concept; and FIG. 15 is a cross-sectional view of the display apparatus of FIG. 14.

Referring to FIGS. 14 and 15, a display apparatus according to an embodiment may be substantially the same as the display apparatus of FIGS. 12 and 13, except that a disconnection portion CT is disposed to overlap an intersection portion TLX where the touch lines TL intersect. Therefore, repeated description is omitted.

The intersection portion TLX in which the touch lines TL cross each other may be disposed to overlap the disconnection portion CT. In an embodiment, since the intersection portion TLX is formed to be larger than the width of the touch line TL, even when a distance between the disconnection portion CT and the touch line TL is relatively far, visibility of the disconnection portion CT can be minimized or reduced.

Figure 16:
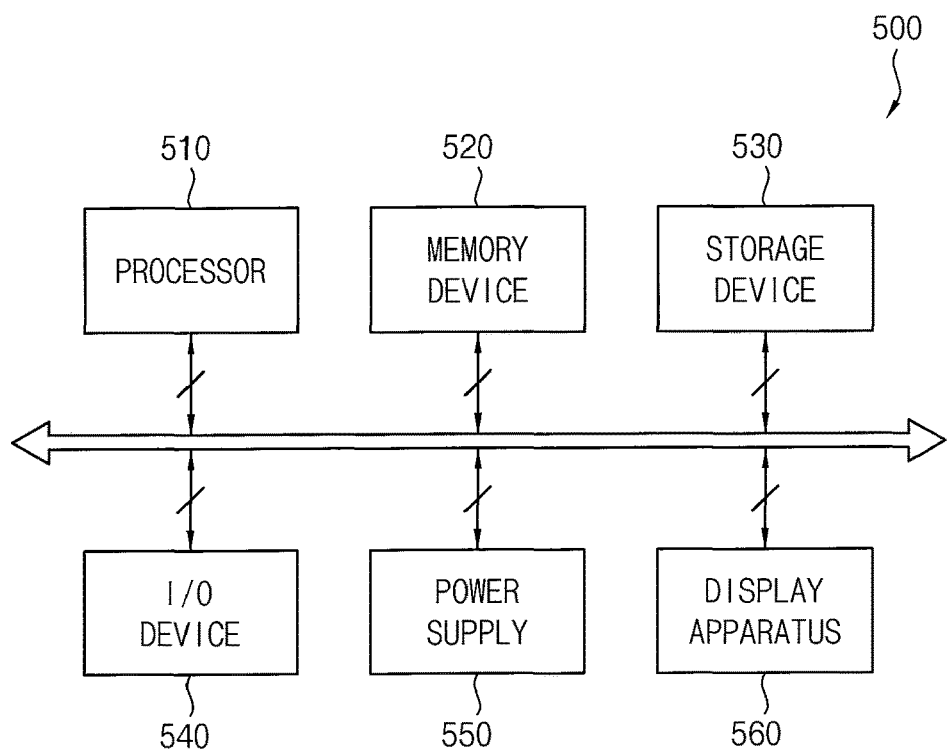
FIG. 16 is a block diagram illustrating an electronic device according to an embodiment of the inventive concept.
Figure 17A:
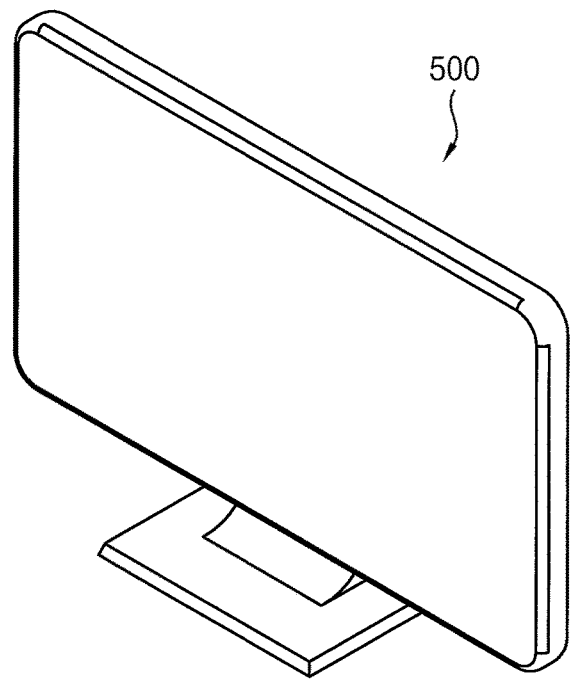
FIG. 17A is a diagram illustrating an example in which the electronic device of FIG. 16 is implemented as a television.

FIG. 16 is a block diagram illustrating an electronic device according to embodiment; FIG. 17A is a diagram illustrating an example in which the electronic device of FIG. 16 is implemented as a television; and FIG. 17B is a diagram illustrating an example in which the electronic device of FIG. 16 is implemented as a smartphone.

Figure 17B:
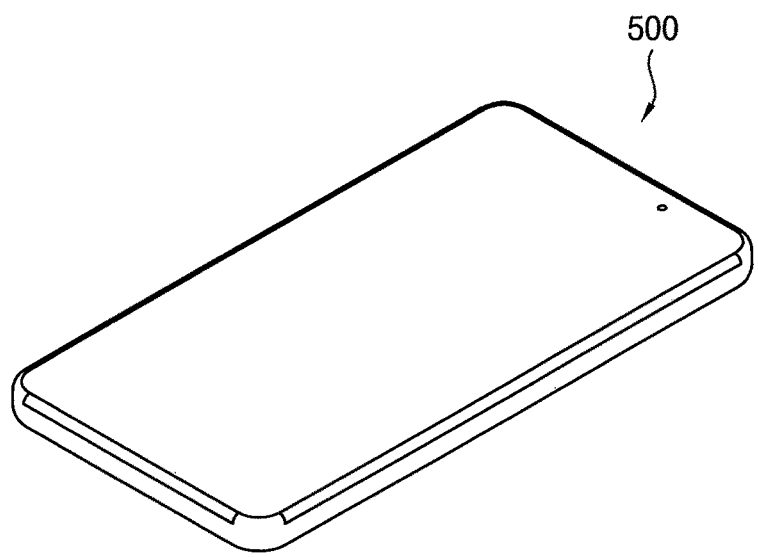
FIG. 17B is a diagram illustrating an example in which the electronic device of FIG. 16 is implemented as a smartphone.

Referring to FIGS. 16 through 17B, an electronic device 500 may include a processor 510, a memory device 520, a storage device 530, an input/output (I/O) device 540, a power supply 550, and a display apparatus 560. Here, the display apparatus 560 may correspond to the display apparatus of FIG. 1. In addition, the electronic device 500 may further include a plurality of ports for communicating with a video card, a sound card, a memory card, a universal serial bus (USB) device, other electronic devices, etc.

In an embodiment, as illustrated in FIG. 17A, the electronic device 500 may be implemented as a television. In another embodiment, as illustrated in FIG. 17B, the electronic device 500 may be implemented as a smartphone. However, embodiments of the electronic device 500 are not limited thereto. For example, the electronic device 500 may be implemented as a cellular phone, a video phone, a smart pad, a smart watch, a tablet PC, a car navigation system, a computer monitor, a laptop, a head mounted display (HMD), etc.

The processor 510 may perform various computing functions. The processor 510 may be a microprocessor, a central processing unit (CPU), an application processor (AP), etc. The processor 510 may be coupled to other components via an address bus, a control bus, a data bus, etc. Further, the processor 510 may be coupled to an extended bus, such as a peripheral component interconnection (PCI) bus. The memory device 520 may store data for operations of the electronic device 500. For example, the memory device 520 may include at least one non-volatile memory device, such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device, such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include any of an input device, such as a keyboard, a keypad, a mouse device, a touchpad, a touchscreen, etc., and an output device, such as a printer, a speaker, etc. The power supply 550 may provide power for operations of the electronic device 500.

The display apparatus 560 may be coupled to other components via the buses or other communication links. In some embodiments, the display apparatus 560 may be included in the I/O device 540. As described above, the display apparatus 560 may have a structure in which the non-display area is reduced, the display area is enlarged, and wiring irregularities are not visually recognized. However, since this has been described above, description thereof will not be repeated.

Embodiments of the present invention may be applied to organic light emitting display devices and various electronic devices including the same, for example. For example, embodiments of the present invention may be applied to a mobile phone, a smartphone, a video phone, a smart pad, a smart watch, a tablet PC, a car navigation system, a television, a computer monitor, a notebook, and the like.

The foregoing is illustrative of the inventive concept and is not to be construed as limiting thereof. Although some embodiments of the inventive concept have been described, those skilled in the art will readily appreciate that many modifications are possible in the embodiments without materially departing from the novel teachings and aspects of the inventive concept. Accordingly, all such modifications are intended to be included within the scope of the inventive concept as set forth in the claims. Therefore, it is to be understood that the foregoing is illustrative of the inventive concept and is not to be construed as limited to the specific embodiments disclosed, and that modifications to the disclosed embodiments, as well as other embodiments, are intended to be included within the scope of the appended claims. The inventive concept is defined by the claims, with equivalents of the claims to be included therein.

What is claimed is:

1. A display apparatus, comprising:
   a substrate comprising a display area in which a plurality of pixel areas is arranged, and a peripheral area adjacent to the display area and in which a pad portion comprising a plurality of pad electrodes is arranged;
   a first signal line and a second signal line in the display area on the substrate;
   a first connecting line electrically connected to the first signal line and connected to the pad portion, wherein at least a portion of the first connecting line is in the display area; and
   a dummy line on a same layer as the first connecting line,
   wherein the first connecting line comprises a horizontal line portion extending in a first direction and a vertical line portion extending in a second direction perpendicular to the first direction,
   wherein the dummy line comprises a horizontal dummy line extending in the first direction and a vertical dummy line extending in the second direction,
   wherein the plurality of pixel areas comprises:
   a first pixel area overlapping the second signal line;
   a second pixel area overlapping the horizontal line portion of the first connecting line; and
   a third pixel area overlapping the vertical line portion of the first connecting line, and
   wherein at least one of the first connecting line and the dummy line has at least one disconnection portion in a pixel area of the first to third pixel areas.

2. The display apparatus of claim 1, wherein the dummy line and the first connecting line together form a matrix lattice with respect to the plurality of pixel areas, and the dummy line and the first connecting line comprise at least one disconnected portion formed therein.

3. The display apparatus of claim 1, wherein vertical branches are extended from the horizontal line portion in the second direction.

4. The display apparatus of claim 1,
   wherein the second pixel area and the third pixel area are closer to an edge of the display area than the first pixel area.

5. The display apparatus of claim 4, wherein
   the horizontal dummy line and the vertical dummy line overlap the first pixel area, and
   the vertical dummy line in the first pixel area has a disconnection portion of the at least one disconnection portion.

6. The display apparatus of claim 4, wherein the display area is arranged in a rectangular shape along the first and second directions, and four corners of the display area have a chamfered or rounded shape, and
   the peripheral area extends in the first direction adjacent to the display area in the second direction, the pad portion extends in the first direction, and the pad electrodes are arranged in the first direction.

7. The display apparatus of claim 6, wherein the display area further comprises a side display area which is extended from at least one edge of the display area and bent.

8. The display apparatus of claim 1, further comprising:
   a thin film transistor layer on the substrate;
   a first conductive pattern on the thin film transistor layer;
   a first via insulating layer on the first conductive pattern; and
   a second conductive pattern on the first via insulating layer,
   wherein the first conductive pattern comprises the first and second signal lines, and
   the second conductive pattern comprises the first connecting line and the dummy line.

9. The display apparatus of claim 8, further comprising a pixel defining layer over the first connecting line and the dummy line, the pixel defining layer defining an opening corresponding to each of the plurality of pixel areas which is an emitting area, and patterns of circuit wirings under the opening of a first pixel area of the plurality of pixel areas, the opening of a second pixel area of the plurality of pixel areas, and the opening of a third pixel area of the plurality of pixel areas are the same.

10. The display apparatus of claim 9, wherein the first pixel area, the second pixel area, and the third pixel area each emit light having a same color.

11. The display apparatus of claim 9, wherein each of the plurality of pixel areas comprises any of a red pixel emitting red light, a green pixel emitting green light, and a blue pixel emitting blue light, and red or blue light is emitted in the first pixel area, the second pixel area, and the third pixel area.

12. The display apparatus of claim 8, further comprising:
a pixel defining layer over the first connecting line and the dummy line, the pixel defining layer defining an opening corresponding to each of the plurality of pixel areas which is an emitting area, and the pixel defining layer comprises a black pigment or a black dye.

13. The display apparatus of claim 8, further comprising:
a planarization insulating layer on the second conductive pattern;

a third conductive pattern on the planarization insulating layer and comprising a first electrode comprising a reflective material;

a light emitting layer on the first electrode; and
a second electrode on the light emitting layer.

14. The display apparatus of claim 13, wherein at least one of the first connecting line and the dummy line comprises vertical branches and adjacent vertical branches adjacent to the vertical branches and extending in a same direction as an extending direction of the vertical branches, wherein the vertical branches and the adjacent vertical branches form a disconnection portion of the at least one disconnection portion, and the third conductive pattern further comprises a cover electrode overlapping the disconnection portion.

15. A display apparatus, comprising:
a substrate comprising a display area in which a plurality of pixel areas is arranged, and a peripheral area adjacent to the display area and in which a pad portion comprising a plurality of pad electrodes is arranged;
a first signal line and a second signal line in the display area on the substrate;
a first connecting line electrically connected to the first signal line and connected to the pad portion, wherein at least a portion of the first connecting line is in the display area; and
a dummy line on a same layer as the first connecting line;
a thin film transistor layer on the substrate;
a first conductive pattern on the thin film transistor layer;
a first via insulating layer on the first conductive pattern;
a second conductive pattern on the first via insulating layer;

a second via insulating layer on the second conductive pattern;
a light emitting structure on the second via insulating layer;
a thin film encapsulation layer on the light emitting structure; and
a touch line on the thin film encapsulation layer,
wherein the first conductive pattern comprises the first and second signal lines,
the second conductive pattern comprises the first connecting line and the dummy line,
at least one of the first connecting line and the dummy line comprises vertical branches and adjacent vertical branches adjacent to the vertical branches and extending in a same direction as an extending direction of the vertical branches, wherein the vertical branches and the adjacent vertical branches form at least one disconnection portion, and
the touch line overlaps the at least one disconnection portion.

16. The display apparatus of claim 15, wherein the touch line comprises a plurality of lines that cross each other, and an intersection where the lines cross overlaps the at least one disconnection portion.

17. A display apparatus, comprising:
a substrate;
a thin film transistor layer on the substrate;
a first conductive pattern on the thin film transistor layer and comprising a first data line and a second data line;
a first via insulating layer on the first conductive pattern; and
a second conductive pattern comprising a connecting line electrically connected to the first data line, and a dummy line spaced apart from the connecting line, and
wherein the connecting line and the dummy line extend in a first direction and a second direction perpendicular to the first direction to form a matrix lattice defining a plurality of pixel areas, and
in a pixel area of the plurality of pixel areas, at least one disconnection portion is formed in the connection line or the dummy line.

18. The display apparatus of claim 17, further comprising:
a second via insulating layer on the second conductive pattern;
a third conductive pattern on the second via insulating layer and comprising a reflective material, the third conductive pattern comprising a first electrode and a cover electrode overlapping the disconnection portion;
a light emitting layer on the first electrode; and
a second electrode on the light emitting layer.

19. The display apparatus of claim 17, wherein the plurality of pixel areas comprises a first pixel area in which the dummy line is located, and a second pixel area in which the connection line is located, and the dummy line of the first pixel area and the connecting line of the second pixel area have a same shape in a plane view except for a position of the disconnection portion.

* * * * *